United States Patent [19]
Bullinger et al.

[11] Patent Number: 5,469,082
[45] Date of Patent: Nov. 21, 1995

[54] PERIPHERAL COMPONENT INTERFACING SYSTEM WITH BUS VOLTAGE/LOGIC SUPPLY COMPARISON MEANS

[75] Inventors: Philip W. Bullinger, Loveland; Michael J. McManus, Fort Collins, both of Colo.

[73] Assignees: AT&T Global Information Solutions Company, Dayton, Ohio; Hyundai Electronics America, Milpitas, Calif.

[21] Appl. No.: 352,331

[22] Filed: Dec. 8, 1994

[51] Int. Cl.⁶ .............................................. H03K 19/0175
[52] U.S. Cl. ................................ 326/81; 326/86; 326/83; 327/81
[58] Field of Search ................................ 326/37, 49, 50, 326/80, 81, 83, 86; 327/63, 77, 81

[56] References Cited

U.S. PATENT DOCUMENTS

| | | | |
|---|---|---|---|
| 5,084,637 | 1/1992 | Gregor | 326/81 |
| 5,144,165 | 9/1992 | Dhong | 326/80 |
| 5,260,612 | 11/1993 | Lehmann | 326/68 |
| 5,300,835 | 4/1994 | Assar | 326/68 |
| 5,396,128 | 3/1995 | Dunning | 326/80 |
| 5,406,140 | 4/1995 | Wert | 326/81 |

*Primary Examiner*—Edward P. Westin
*Assistant Examiner*—Andrew Sanders
*Attorney, Agent, or Firm*—Wayne P. Bailey

[57] ABSTRACT

Voltage levels of an external bus are sampled with results stored to adjust both an output driver and input receiver. The resulting logic signal levels for the input/output (I/O) interface are maintained within acceptable ranges of the standard I/O signal levels.

13 Claims, 2 Drawing Sheets

5,469,082

PERIPHERAL COMPONENT INTERFACING SYSTEM WITH BUS VOLTAGE/LOGIC SUPPLY COMPARISON MEANS

BACKGROUND OF THE INVENTION

1. Field of the Invention

The present invention relates to systems and methods for controlling the interface of digital circuits with other circuitry. More particularly, the present invention relates to apparatus and processes for controlling the voltage levels employed for logic control signals introduced to digital input/output (I/O) circuits.

2. Description of the Related Art

Socket compatible input receivers and output drivers have existed in the prior art. Their capabilities are featured in the "VS500 Standard Cell Library" or the 0.75 mm standard cell library offered by NCR Microelectronics and its associated data books and application notes. To accomplish the voltage sense function, however, the prior art either uses a bandgap reference voltage to determine the voltage level of the supply, or relies on external control input from outside the integrated circuit device.

The Peripheral Component Interconnect (PCI) standard was established by an organization of many members of the industry known as the PCI Special Interest Group (PCISIG). The PCI specification defines two operating voltage regions including the provision of devices switching between the two. That specification does not discuss the capability of dynamically switching between the two regions without any control input as is realized through the present invention.

SUMMARY OF THE INVENTION

The present invention advantageously utilizes a voltage sense comparator circuit that requires considerably less physical space and is easier to consistently manufacture than bandgap reference voltage generators.

Apparatus in accordance with this invention adjusts the voltage levels of logic control signals present at a circuit node intended to function as a bidirectional input and output interface for logic circuitry. The structure operates in the presence of an interface bus supply voltage, and a supply voltage for the logic circuitry, where both voltages must conform to predetermined standard voltage levels. For this purpose, a voltage sense circuit responds to an enabling signal for comparing the bus supply voltage and the logic circuit supply voltage. The results of this comparison produces an output voltage sense control signal.

An output driver logic circuit responds to the voltage sense control signal by introducing a voltage level to the circuit node which voltage level corresponds to a logic output voltage level. In addition, an output receiver logic circuit responds to the aforesaid voltage sense output signal for driving the logic circuitry of the system with a voltage having a level determined by the voltage sense control signal.

The voltage sense circuit includes an arrangement for storing the result of comparing the bus supply voltage and the logic circuit supply voltage for maintaining a signal corresponding to the comparison result whenever an enabling signal is absent from the comparison circuit input. A preferred structure for this storage means is a keeper cell circuit. The output driver circuit is further responsive to output data and an enabling signal both from the logic circuitry for producing a signal having the logic value of the output data at the circuit node, and further having a voltage level established by the comparison result signal.

Preferably, the output driver circuit includes a plurality of transistors connected for respectively responding to the comparison result signal, the output data and the enabling signal. This circuitry can further include an arrangement for coupling the interface bus supply voltage for powering those transistors thereby tracking variations of the interface bus supply voltage.

The input receiver logic circuit includes an input signal threshold detection circuit responsive to the comparison result signal for determining whether voltage levels present at the circuit mode are valid logic signals. The output of this threshold detection circuit drives a voltage level shifter circuit responsive to that output for producing an output signal into the logic circuitry which matches the corresponding logic signal level thereof. The input receiver logic circuit will follow variations in the bus supply voltage by coupling the network of transistors implementing the receiver logic circuit so that at least a portion of them receive power from the interface bus supply voltage.

The present invention is likewise concerned with the method of interfacing logic signals into and out of a chip through a common pad connection wherein the pad output driver is powered by a predetermined standard bus voltage, and the core/logic circuitry is powered by a core supply voltage for producing output data. The process is initiated by comparing the bus voltage and the core supply voltage for generating a voltage sense control signal. That voltage sense control signal is combined with output data and an enabling signal for driving pad with logical data having signal levels corresponding to the standard bus voltage.

The next step is to detect whether signals at the pad are at an appropriate level for correlating to a threshold of either a high logic level or a low logic level. Finally, the signals from the detecting step are shifted for matching the logic signal levels of the chip. This method can further include the step of tracking variations of the bus voltage while performing the comparing, responding and detecting steps.

Those having normal skill in the art will recognize the foregoing and other objects, features, advantages and applications of the present invention from the following more detailed description of the preferred embodiments as illustrated in the accompanying drawings.

DETAILED DESCRIPTION OF THE PREFERRED EMBODIMENTS

The present invention relates to input/output (I/O) pad architecture that is particularly useful for implementing the Peripheral Component Interconnect (PCI) standard. The PCI standard defines two operating environment signaling ranges, namely, a high voltage range of 5.0 volts (+/−5%), and a low voltage range of 3.3 volts (3.0–3.6 volts). The high voltage range is specified in terms of fixed logic thresholds, much like the industry standard TTL interface.

The low voltage range, however, is specified as a proportional interface centered at 0.4×Vdd. This requires that, for low voltage signaling environments, the output drivers and input receivers track variations in Vdd between 3.0 and 3.6 volts. Conversely, in high voltage signaling environments, the output drivers and input receivers must exhibit fixed logic thresholds.

The advantages of the universal PCI pad architecture in accordance with this invention are in its ability to dynamically adjust the circuit configurations of both the input receiver and output driver to meet PCI bus specifications at both the high voltage (5 V) and low voltage (3.3 V) ranges. The present invention advantageously utilizes circuitry that senses the voltage of the external PCI bus, captures and stores this information, and dynamically adjusts output driver and input receiver circuit configurations accordingly.

Prior and existing PCI I/O pad designs are limited in that they cannot operate at both the high and low voltage signaling environments, and/or they require an external control input to manually switch between the high and low voltage signaling environments. The invention described here will allow a device embodying them to dynamically operate in both PCI environments with no manual control inputs required. This is especially useful in an integrated circuit product that may have an equal probability of utilization in either signaling environment, and dynamically switch between them.

Figure 1:
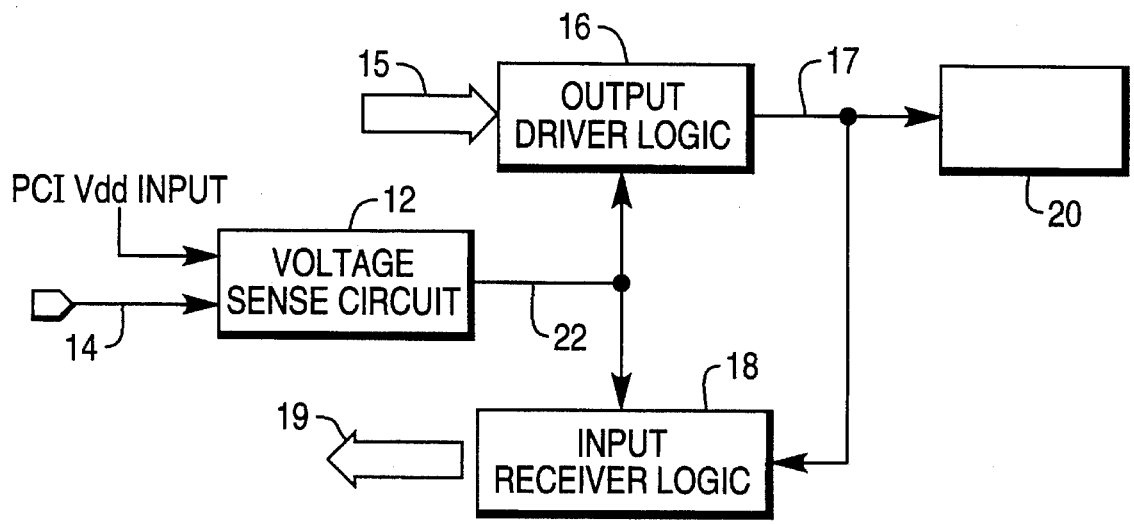
FIG. 1 is a block diagram of the system which interfaces with the bond pads in accordance with this invention.

The PCI I/O pad architecture, as implemented in accordance with this invention, is illustrated in FIG. 1 with three logic blocks: 1) the output driver 16, 2) the input receiver 18, and 3) the voltage sense circuit 12. That is, FIG. 1 presents a block diagram highlighting the top-level architecture for a universal PCI I/O pad in accordance with the present invention.

In FIG. 1, the output driver logic 16 performs the function of driving internally generated logic signals off the chip through the bond pad 20 at the appropriate PCI bus voltage level. Typically, bond pad 20 is an aluminum pad of about 5 mils square which mechanically establishes electrical communications with the circuitry through physical engagement of a pin from an integrated circuit component.

The input receiver 18, which is also connected to the bond pad 20, receives a logic signal coming into the chip, compares the input to a preset threshold trip point, and drives it into the chip (not shown) with the appropriate logic level. The voltage sense circuit 12 monitors the PCI bus voltage and outputs either a low or a high logic signal, depending on whether the PCI bus is operating in its high (5 V) or low (3.3 V) voltage range. Voltage sense circuit 12 monitors the operating voltage level of the PCI bus in the presence of an enabling signal at input 14 and stores this condition when the enable condition is removed. Typically, the enabling condition is the chip reset signal.

Figure 2:
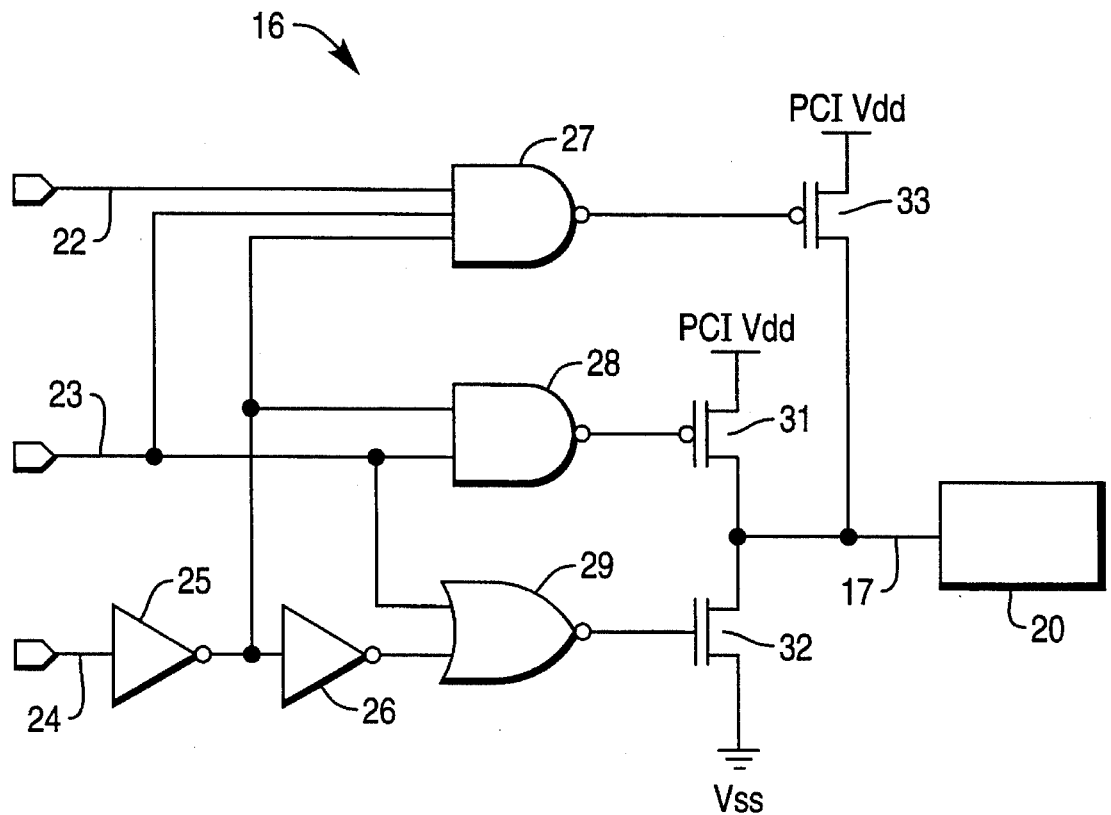
FIG. 2 is a circuit diagram of an output driver circuit of FIG. 1.

The output driver logic 16 is shown in greater detail in FIG. 2. It functions to drive signals from the core logic to the external environment through the bond pad 20. There are three inputs to the output driver logic 16 as shown in FIG. 1; namely, output data 23, and output enable control 24 (which together form multiple connector input 15 of FIG. 1), along with a voltage sense control 22 from circuit 12.

The output enable signal at input 24 determines whether the I/O driver is in tri-state or not. When output enable 24 is deasserted to a logic high state, transistors 31, 32 and 33 are all forced into their off state which results in a tri-state condition on the output pad 20. Conversely, when the output enable 24 is asserted to a logic low state, transistors 31, 32 and/or 33 function to drive the logic value on the data out signal 23 to the output pad 20.

The voltage sense input 22 controls whether or not transistor 33 is enabled. When this input is a logic low, transistor 33 is disabled. In this configuration, the AC and DC characteristics of the output driver are determined by the output driver transistors 31 and 32 only. When the voltage sense input 22 is a logic high, transistor 33 is enabled, and functions as the pullup driver in parallel with transistor 31. When compared with the electrical characteristics of the driver formed by transistors 31 and 32 only, the addition of transistor 33 alters the output driver AC and DC characteristics by increasing the output source current from the PCI Vdd rail.

Re-configuring the output transistor architecture based on the supply voltage of the PCI bus interface allows the output driver to match PCI bus specifications at both the 5 V and 3.3 V levels. Also, because the output transistors are all connected to the PCI bus voltage supply (PCI Vdd), the output signal characteristics will follow PCI supply voltage variations across the 3.0 volts to 3.6 volts specification. This is a requirement for PCI compliant systems, as the low voltage (3.3 V) specification is defined as a voltage range from 3.0 to 3.6 volts.

Figure 3:
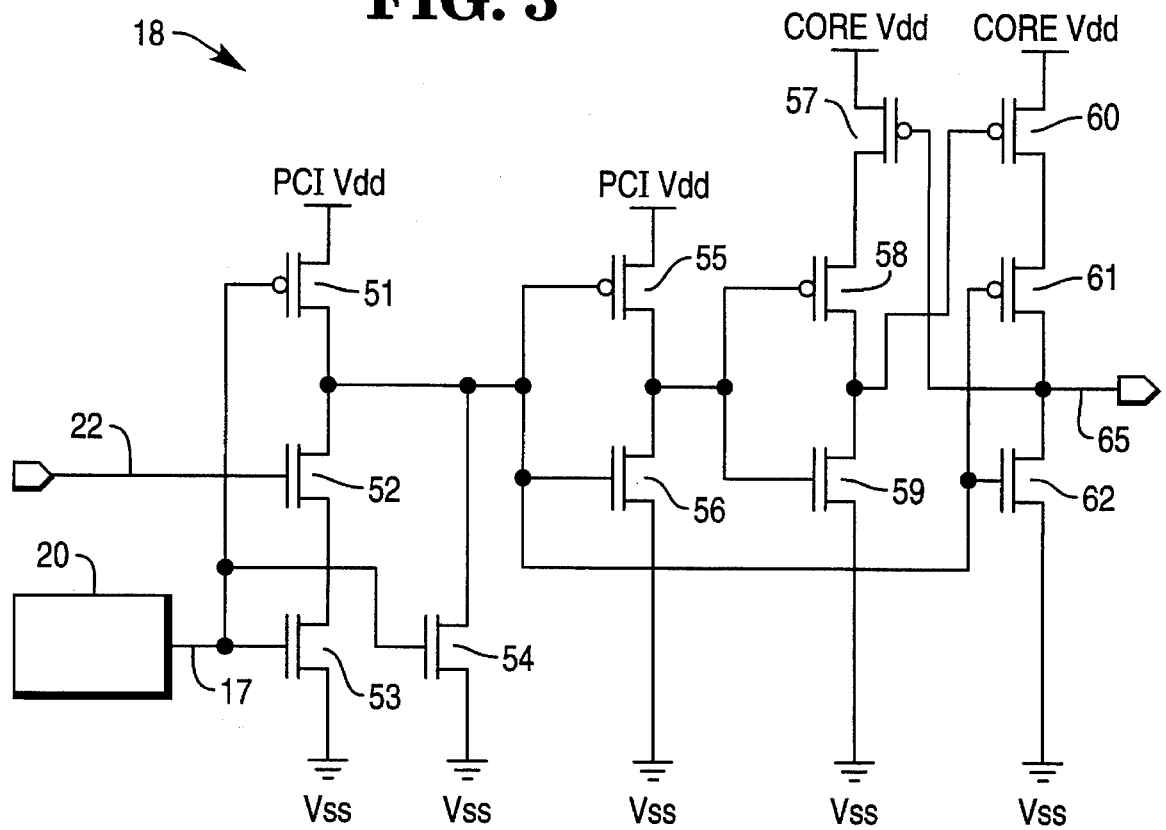
FIG. 3 is a circuit diagram of the input receiver circuit for use in a FIG. 1 type of system

The input receiver logic 18 shown in FIG. 3 functions to drive signals present at the bond pad 20 and into the core logic of the chip. The inputs to this circuit are the incoming signal at the bond pad 20 and the voltage sense control input 22.

Transistors 51 through 54 function as the input signal threshold detection logic for the input receiver. These devices work together to determine the voltage levels at which an input signal on the bond pad 20 is considered a valid logic low or logic high. As in the case of the output driver circuit, these transistors are connected to the PCI bus voltage supply PCI Vdd to follow voltage variations across the 3.0 volts to 3.6 volts specification.

The voltage sense control input 22 functions to adjust the input receiver threshold characteristics as the PCI bus supply voltage PCI Vdd transitions between its high (5 V) and low (3.3 V) levels. When this input is a logic low, transistor 52 is disabled which electrically disconnects transistor 53 from the circuit. In this configuration, the input transistor pair of transistors 51 and 54 determine the input threshold characteristics for the input receiver 18 to accommodate the low voltage range of the PCI specification.

When the voltage sense control input 22 is a logic high, transistor 52 is enabled which electrically connects transistor 53 in parallel with transistor 54. In this configuration, the voltage threshold level at which a logic high is recognized is lowered to accommodate the low voltage range of the PCI specification.

Transistors 55 through 62 function as the voltage level shifters in the input receiver. As an example, if the PCI bus supply voltage was in its low voltage state of 3.3 volts and the core voltage supply Core Vdd was at 5 volts, the level shifter would pull the incoming 3 V signal up to 5 V levels before driving it into the core logic. If both the PCI and Core voltage supplies are at the same level, the level shifter simply functions as a buffer for the incoming signal from pad 20. The level shifter also functions as a buffer if the PCI bus voltage is at 5 V and the Core logic is at 3 V.

Figure 4:
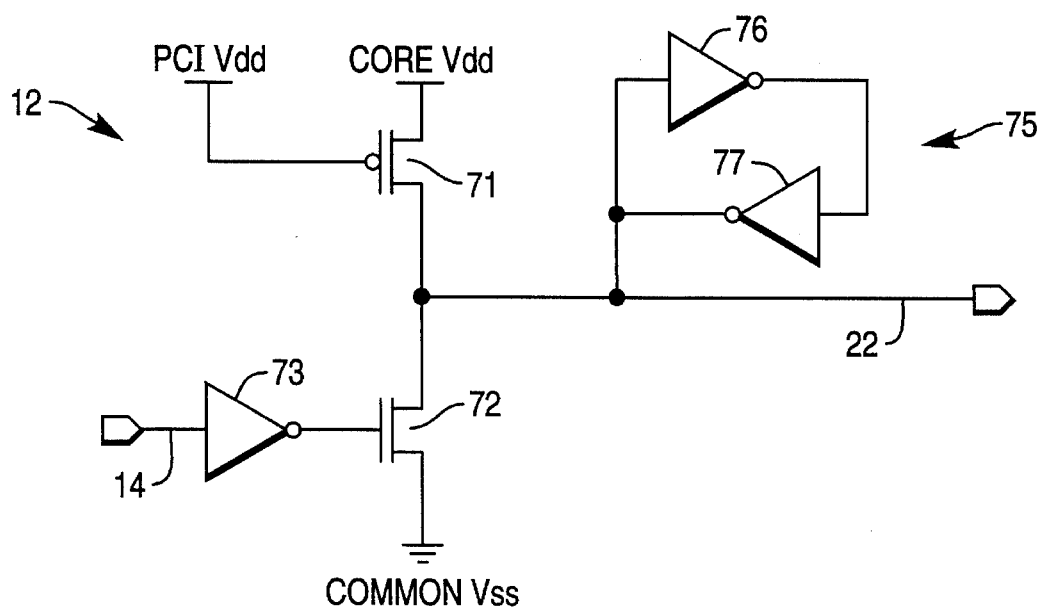
FIG. 4 is a circuit diagram of a voltage sense circuit of a FIG. 1 system.

The voltage sense circuit 12 is shown in greater detail in FIG. 4. It functions to compare the PCI bus voltage PCI Vdd to the supply voltage (Core Vdd) in the core logic and outputs a control signal at 22.

Transistor 71 is turned on when the PCI supply voltage PCI Vdd is more than a transistor threshold below the level of the core voltage supply Core Vdd. Conversely, when the two voltages are within a threshold of one another, transistor 71 is turned off. Typical transistor threshold voltages are between 0.7 and 0.9 volts. Transistor 72 is a small device that functions as a resistive pull-down when the enable signal at input 14 is asserted to its logic low state.

The pair of inverters 76 and 77 form a Keeper Cell 75, and operate to preserve the logic state of the output control signal 22 when transistors 71 and 72 are not conducting. Note that each of inverters 76 and 77 (as well as other inverter circuits shown in the drawings, such as elements 73 and 74) are powered by standard couplings to Core Vdd and Common Vss. Inverter 77 has very low drive capability which allows the keeper function to be easily driven to a new state by either transistor 71 or 72. Transistors 71 and 72 are designed to easily overdrive the output of inverter 77, thereby allowing a new logic state signal on output 22.

The voltage sense circuit 12 of FIG. 4 operates as follows: When enable input 14 in FIG. 1 is asserted to a logic low state, which will usually occur at power-up and other system level reset conditions, transistor 72 is conducting, and will act as a weak resistive pull-down on the output control signal 22. If transistor 71 is also conducting, the output signal 22 is pulled up by the significantly stronger transistor 71 to the level of Core Vdd. If transistor 71 is turned off, transistor 72 will hold the output control signal 22 at a logic low level. When enable input 14 is deasserted by being driven to a logic high level, transistor 72 is turned off. If transistor 71 is conducting, the output 22 will remain at a logic high level, but, with transistor 71 turned off, the Keeper Cell 75 holds the output signal 22 at the logic low level.

As an example, if the PCI supply voltage PCI Vdd is at 3.3 volts and the core supply voltage Core Vdd is at 5.0 volts, transistor 71 is turned on, and the output signal 22 is at a logic high. Signal 22 connects to the PCI I/O pad driver 16, as well as to receiver logic 18 in FIG. 1 to configure them for 3.3 V PCI bus characteristics. If the two supplies are at the same high voltage (within a threshold), then transistor 71 is off and 72 will pull the output down to a logic low level where it is maintained by keeper cell 75 when input 14 is driven high to end the enable condition.

This example illustrates a configuration where the Core Vdd is 5 V and is compared to either a high PCI Vdd of 5 V, or low PCI Vdd of 3.3 V. By switching PCI Vdd and Core Vdd (shown in FIG. 4), the same circuit is useful with a Core Vdd of 3.3 V and PCI Vdd either 3.3 V or 5 V.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. Apparatus for adjusting the voltage levels of logic signals present at a circuit node intended to function as an input and output interface for logic circuitry, comprising:

a voltage sense circuit responsive to an enabling signal for comparing a bus supply voltage and a logic circuit supply voltage, and for producing a first output signal as a result of that comparison;

an output driver logic circuit responsive to said first output signal for introducing a voltage level to said circuit node corresponding to a logic output voltage level; and a receiver logic circuit responsive to said first output signal for driving said logic circuitry with a voltage having a level corresponding to said first output signal.

2. Apparatus in accordance with claim 1 wherein said voltage sense circuit includes means for maintaining said first output signal whenever said enabling signal is absent.

3. Apparatus in accordance with claim 2 wherein said means for maintaining is a keeper cell circuit.

4. Apparatus in accordance with claim 1 wherein said output driver circuit is further responsive to output data and an enabling signal, both of which are produced by the logic circuitry, for generating a signal having the logic value of said output data at the circuit node with the voltage level thereof established by said first output signal.

5. Apparatus in accordance with claim 4 further comprising a plurality of transistors connected for respectively responding to said first output signal, said output data and said enabling signal; said apparatus further including means for powering said transistors by said interface bus supply voltage for tracking variations of said interface bus supply voltage.

6. Apparatus in accordance with claim 1 wherein said receiver logic circuit includes an input signal threshold detection circuit responsive to said first output signal for determining whether voltage levels present at the circuit mode are valid logic signals.

7. Apparatus in accordance with claim 6 wherein said input receiver logic circuit further includes a voltage level shifter circuit responsive to the output of said threshold detection circuit for producing an output signal into the logic circuitry which matches the corresponding logic signal level thereof.

8. Apparatus in accordance with claim 7 wherein said receiver logic circuit is comprised of a network of transistors at least a portion of which are coupled for receiving power from said interface bus supply voltage.

9. A method of interfacing logic signals into and out of logic circuitry through a common I/O pad connection, comprising the steps of:

comparing a bus voltage and a logic circuitry supply voltage for generating a voltage sense control signal; and responding to said voltage sense control signal for driving said I/O pad with logical data having signal levels corresponding to said bus voltage.

10. The method of claim 9 further comprising the steps of:

detecting whether signals at said pad are at an appropriate level for correlating to a threshold of either a high logic level or a low logic level; and shifting the signals from said detecting step for matching the logic signal levels of said chip.

11. The method in accordance with claim 9 further comprising the step of tracking variations of said bus voltage while performing said comparing and responding steps.

12. The method in accordance with claim 10 which includes the step of tracking variations of said bus voltage while performing said detecting steps.

13. The method in accordance with claim 9 wherein said I/O pad is driven by a pad output driver that is powered by said bus voltage.

* * * * *